(12) United States Patent
Yang et al.

(10) Patent No.: US 10,614,898 B1
(45) Date of Patent: Apr. 7, 2020

(54) ADAPTIVE CONTROL OF MEMORY CELL PROGRAMMING VOLTAGE

(71) Applicant: SanDisk Technologies LLC, Addison, TX (US)

(72) Inventors: Xiang Yang, Santa Clara, CA (US); Huai-yuan Tseng, San Ramon, CA (US); Deepanshu Dutta, Fremont, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 20 days.

(21) Appl. No.: 16/143,916

(22) Filed: Sep. 27, 2018

Related U.S. Application Data

(60) Provisional application No. 62/733,494, filed on Sep. 19, 2018.

(51) Int. Cl.
*G11C 16/34* (2006.01)
*G11C 16/10* (2006.01)
*G11C 11/56* (2006.01)

(52) U.S. Cl.
CPC ...... *G11C 16/3454* (2013.01); *G11C 11/5628* (2013.01); *G11C 16/10* (2013.01)

(58) Field of Classification Search
CPC .. G11C 16/3454; G11C 11/5628; G11C 16/10
See application file for complete search history.

(56) References Cited

U.S. PATENT DOCUMENTS

| | | | |
|---|---|---|---|
| 6,888,758 B1 | 5/2005 | Hemink et al. | |
| 7,224,614 B1 * | 5/2007 | Chan | G11C 11/5628 365/185.03 |
| 7,239,557 B2 | 7/2007 | Ha | |
| 7,310,255 B2 * | 12/2007 | Chan | G11C 8/08 365/185.03 |
| 7,450,426 B2 | 11/2008 | Li et al. | |
| 7,630,255 B2 | 12/2009 | Yang | |
| 7,796,435 B2 * | 9/2010 | Cernea | G11C 11/5628 365/185.01 |
| 7,855,913 B2 * | 12/2010 | Fernandes | G11C 11/5628 365/185.03 |
| 8,036,044 B2 | 10/2011 | Dong et al. | |

(Continued)

*Primary Examiner* — Tri M Hoang
(74) *Attorney, Agent, or Firm* — Vierra Magen Marcus LLP

(57) ABSTRACT

Disclosed herein is related to a system and a method of adjusting a programming pulse for programming memory cells. In one aspect, the system includes a controller that iteratively applies a programming pulse to the memory cells during programming loops. The programming pulse has progressively increasing magnitudes to program different subsets of the memory cells to corresponding target states. The controller determines that a programming loop to program a subset of the memory cells targeted to have a corresponding target state of the target states is performed. The controller counts a number of memory cells of the subset that have not reached the target state. The controller determines a magnitude for a programming pulse to be applied for a subsequent programming loop based on the counted number, and applies, during the subsequent programming loop, the programming pulse with the determined magnitude.

21 Claims, 8 Drawing Sheets

(56) References Cited

U.S. PATENT DOCUMENTS

| | | | |
|---|---|---|---|
| 8,619,475 B2 * | 12/2013 | Aritome | G11C 11/5628 |
| | | | 365/185.19 |
| 8,670,273 B2 * | 3/2014 | Aritome | G11C 16/10 |
| | | | 365/185.03 |
| 8,743,632 B2 | 6/2014 | Kim et al. | |
| 8,873,293 B1 | 10/2014 | Ou et al. | |
| 8,902,658 B1 | 12/2014 | Raghu et al. | |
| 8,958,249 B2 | 2/2015 | Dutta et al. | |
| 9,286,987 B1 * | 3/2016 | Dong | G11C 16/10 |
| 9,349,478 B2 * | 5/2016 | Yuan | G11C 16/3427 |
| 9,460,779 B2 * | 10/2016 | Ho | G11C 11/1673 |
| 9,548,124 B1 | 1/2017 | Hazeghi et al. | |
| 9,685,233 B2 * | 6/2017 | Hsieh | G11C 16/10 |
| 9,728,278 B2 * | 8/2017 | Muchherla | G11C 29/50004 |
| 9,852,065 B1 * | 12/2017 | Rajwade | G11C 16/10 |
| 9,865,352 B2 * | 1/2018 | Miao | G11C 16/10 |

* cited by examiner

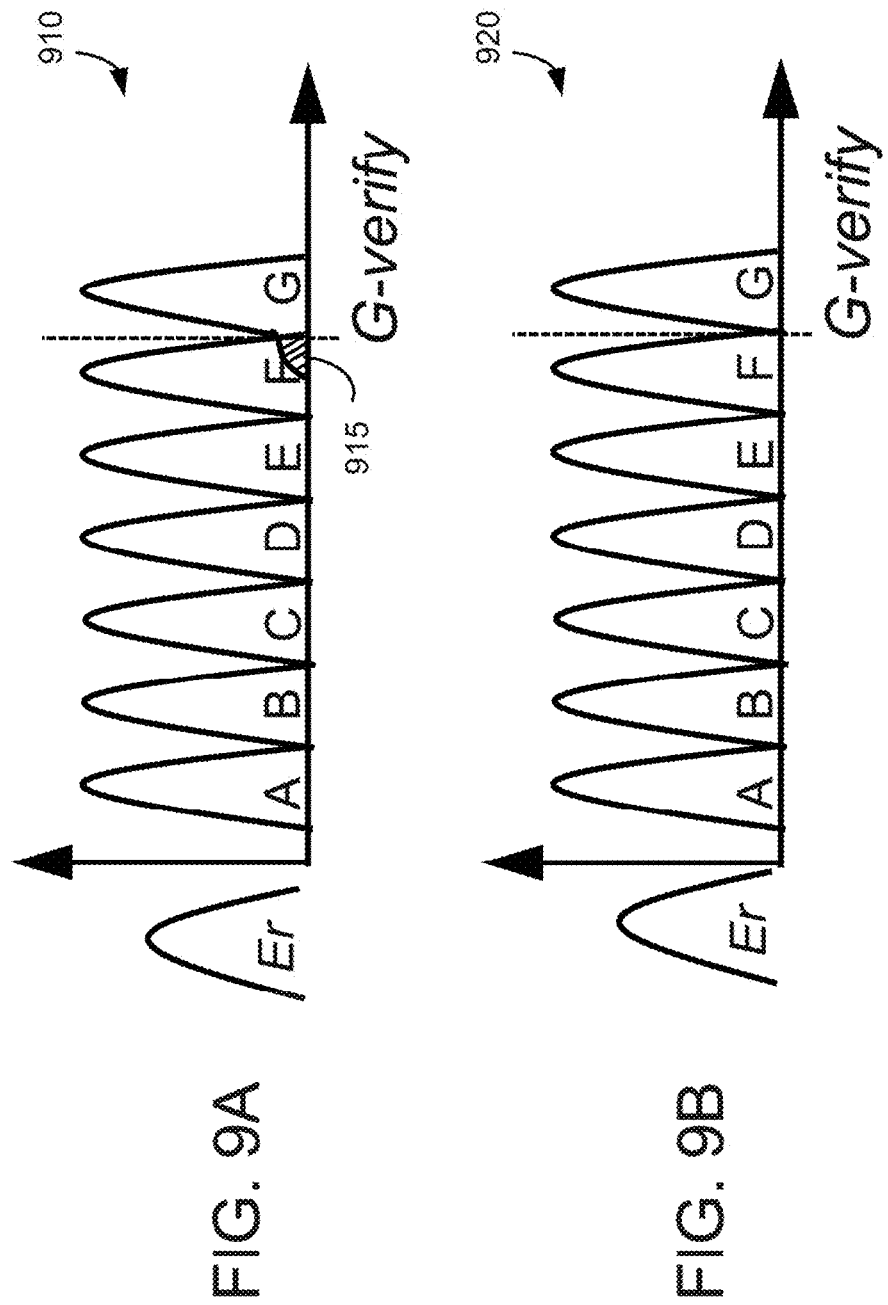

ADAPTIVE CONTROL OF MEMORY CELL PROGRAMMING VOLTAGE

CROSS-REFERENCE TO RELATED APPLICATION

This application claims priority to U.S. Provisional Application No. 62/733,494 filed Sep. 19, 2018, which is incorporated herein by reference in its entirety.

BACKGROUND

The following description is provided to assist the understanding of the reader. None of the information provided or references cited is admitted to be prior art.

Semiconductor memory has become more popular for use in various electronic devices. Semiconductor memory may be implemented in cellular telephones, digital cameras, personal digital assistants, mobile computing devices, non-mobile computing devices and other devices. Operating a memory device includes applying different voltages to program memory cells. In one approach, a flash memory device is operated by applying different programming pulses to memory cells during different programming loops to program different memory cells to corresponding target states. For example, a first memory cell of the memory cells is programmed to a first state (e.g., "A" state) by applying a first programming pulse having a first programming voltage to the memory cells during a first programming loop, and a second memory cell of the memory cells is programmed to a second state (e.g., "B" state) by applying a second programming pulse having a second programming voltage higher than the first programming voltage to the memory cells during a second programming loop.

In one approach, a voltage is iteratively incremented from a starting programming voltage by a voltage step to obtain different programming voltages during different programming loops. A larger voltage step allows a programming voltage different from the starting programming voltage to be obtained in fewer programming loops. However, a larger voltage step may render a programming voltage that is excessive for programming a memory cell to its target state. Such an excessive programming voltage may alter programmed states of other memory cells. A smaller voltage step reduces the likelihood of an excessive programming voltage. However, the smaller voltage step generally requires a larger number of programming loops to obtain the programming voltage for programming the memory cell to its target state. Assuming as an example that a starting programming voltage is 12V and a sufficient programming voltage for programming a memory cell with a target state is 20.5V, if a voltage step is 1.2V, a programming voltage of 21.6V will be obtained after 9 programming loops, and that programming voltage will have an excessive voltage of 1.1V. However, if the voltage step is 0.4V instead of 1.2V, a programming voltage of 20.8V will be obtained after 23 programming loops and will result in a 0.3V of excessive voltage. Thus, iteratively incrementing a voltage by a fixed voltage step to obtain a programming voltage is subject to a tradeoff between accuracy and speed.

SUMMARY

Various embodiments disclosed herein are related to a device comprising memory cells and a controller coupled to the memory cells. The controller is configured to iteratively apply a programming pulse to the memory cells during programming loops. The programming pulse has progressively increasing magnitudes to program different subsets of the memory cells to corresponding target states. The controller is configured to determine that a programming loop to program a subset of the memory cells targeted to have a corresponding target state of the target states is performed. The controller is configured to count a number of memory cells of the subset that have not reached the corresponding target state. The controller is configured to determine a magnitude for the programming pulse to be applied for a subsequent programming loop based on the counted number. The controller is configured to apply the programming pulse with the determined magnitude to memory cells of the subset that have not reached the target state during the subsequent programming loop. In one or more embodiments, the subsequent programming loop is a final programming loop, and the corresponding target state is a last target state.

In one or more embodiments, the progressively increased magnitudes of the programming pulse iteratively applied during the programming loops are increased by a step size. A difference between a magnitude of the programming pulse applied in the programming loop and the determined magnitude of the programming pulse applied in the final programming loop is less than the step size.

In one or more embodiments, the controller is configured to determine the magnitude of the programming pulse for the final programming loop by comparing the counted number to at least one of a voltage control function and a look up table.

In one or more embodiments, the controller is configured to determine that the programming loop to program the subset of the memory cells targeted to have the last target state of the target states is performed by counting a number of memory cells from the memory cells having threshold voltages less than a verification voltage of the subset, and determining whether the number of memory cells from the memory cells having the threshold voltages less than the verification voltage satisfies a predetermined number.

In one or more embodiments, the controller is configured to count the number of memory cells of the subset that have not reached the target state by counting the number of memory cells from the memory cells having threshold voltages less than a verification voltage of the subset.

In one or more embodiments, the programming pulse applied in the final programming loop causes the memory cells from the subset having the threshold voltages less than the verification voltage to have threshold voltages equal to or higher than the verification voltage.

Various embodiments disclosed herein are related to a system comprising a set of memory cells, a programming circuit coupled to the set of memory cells, and a programming correction circuit coupled to the programming circuit. The programming circuit is configured to program the set of memory cells according to a plurality of programming pulses. The programming correction circuit includes a counting circuit configured to count a number of first memory cells from a selected subset of the set of memory cells. The first memory cells are programmed with threshold voltages less than a verification voltage of the selected subset. The programming correction circuit further includes a voltage step control circuit configured to determine a voltage step according to the counted number, and program the first memory cells according to a final programming pulse. A magnitude of the final programming pulse is different from a magnitude of one of the plurality of programming pulses by the voltage step.

In one or more embodiments, the magnitude of the one of the plurality of programming pulses is larger than magnitudes of the others of the plurality of programming pulses.

In one or more embodiments, the programming circuit is configured to program different subsets of the set of memory cells to have non-overlapping ranges of threshold voltages. The selected subset may be programmed with a highest one of the non-overlapping ranges of threshold voltages.

In one or more embodiments, the programming circuit is configured to generate other programming pulses for programming other subsets of the set of memory cells. The other programming pulses may have magnitudes iteratively increased by another voltage step larger than the voltage step.

In one or more embodiments, the voltage step control circuit is configured to determine the voltage step by comparing the counted number to at least one of a voltage control function and a look up table.

In one or more embodiments, the voltage step control circuit is configured to set the voltage step to a first level in response to the counted number being between a first predetermined number and a second predetermined number higher than the first predetermined number, and set the voltage step to a second level higher than the first level in response to the counted number being between the second predetermined number and a third predetermined number higher than the second predetermined number.

In one or more embodiments, the counting circuit is further configured to count a second number of second memory cells from the selected subset. The second memory cells may be programmed with threshold voltages higher than the verification voltage. The system may further include a state determination circuit coupled to the counting circuit and the voltage step control circuit. The state determination circuit may be configured to compare the second number and a predetermined number, and initiate a count of the number of the first memory cells in response to determining that the second number is higher than the predetermined number.

In one or more embodiments, the counting circuit is further configured to count a second number of second memory cells from the set of memory cells. The second memory cells may not have a target state of the selected subset. The system may further include a state determination circuit coupled to the counting circuit and the voltage step control circuit. The state determination circuit may be configured to compare the second number and a predetermined number, and initiate a count of the number of the first memory cells in response to determining that the second number is less than the predetermined number.

Various embodiments disclosed herein are related to a system including a set of memory cells, a word line driver coupled to a word line of the set of memory cells, and a controller coupled to the word line driver. The controller is configured to control the word line driver to apply different programming voltages to corresponding subsets of the set of memory cells. The different programming voltages are incremented by a voltage step. The controller is further configured to determine a number of under-programmed memory cells from a first subset of the subsets. The controller is further configured to decrease the voltage step based on the determined number. The controller is further configured to increase a programming voltage applied to the under-programmed memory cells by the decreased voltage step. The controller is further configured to control the word line driver to apply the increased programming voltage to the under-programmed memory cells.

Various embodiments disclosed here are related to a method including iteratively applying a programming pulse to a set of memory cells during programming loops. The programming pulse has progressively increasing magnitudes according to a step size to program different subsets of the set of memory cells to corresponding target states. The method further includes determining that a next programming loop to be performed is a final programming to program a subset of the set of memory cells targeted to have a last target state of the target states. The method further includes counting a number of memory cells of the subset that have not reached the last target state. The method further includes decreasing the step size of the programming pulse for the final programming loop in accordance with the number of memory cells of the subset that have not reached the last target state. The method further includes increasing a magnitude of the programming pulse by the decreased step size for the final programming loop. The method further includes applying the programming pulse with the increased magnitude according to the decreased step size to the set of memory cells during the final programming loop.

In one or more embodiments, determining that the next programming loop to be performed is the final programming loop includes counting a number of memory cells from the set of memory cells having threshold voltages less than a verification voltage of the subset, and determining whether the number of memory cells from the set of memory cells having the threshold voltages less than the verification voltage satisfies a predetermined number.

In one or more embodiments, the programming pulse applied in the final programming loop causes the memory cells from the subset having the threshold voltages less than the verification voltage to have threshold voltages equal to or higher than the verification voltage.

In one or more embodiments, the method further includes programming the different subsets of the set of memory cells to have non-overlapping ranges of threshold voltages. The subset may have a highest one of the non-overlapping ranges of threshold voltages.

In one or more embodiments, decreasing the step size includes applying the number to at least one of a voltage control function and a look up table to determine the step size of the programming pulse for the final programming loop.

In one or more embodiments, decreasing the step size includes setting the step size to a first level in response to the number being between a first predetermined number and a second predetermined number higher than the first predetermined number, and setting the step size to a second level higher than the first level in response to the number being between the second predetermined number and a third predetermined number higher than the second predetermined number.

BRIEF DESCRIPTION OF THE DRAWINGS

FIG. 9A illustrates distributions of threshold voltages programmed after programming a last target state, according to an example embodiment.

FIG. 9B illustrates distributions of threshold voltages programmed after adjusting the under-programmed memory cells of FIG. 9A, according to an example embodiment.

Figure 1:
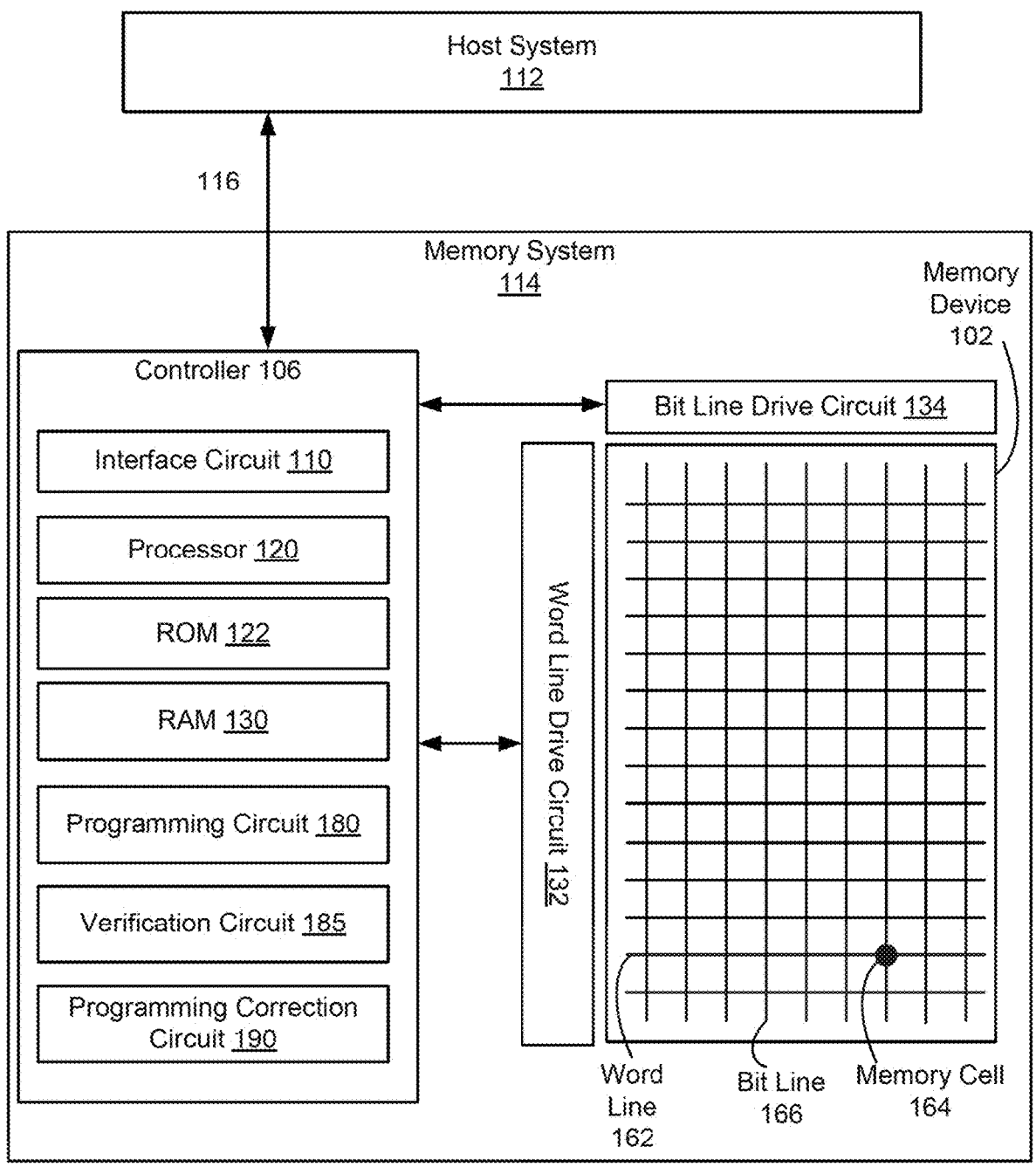
FIG. 1 is a block diagram of a computer system according to an example embodiment.

The foregoing and other features of the present disclosure will become apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and make part of this disclosure.

Various embodiments of a system and a method of adaptively adjusting a programming pulse for programming memory cells are disclosed herein. In one embodiment, the system includes a controller. A controller may be any component, logic, circuit, or the like configured to control operations of the memory cells.

In one aspect, the controller is configured to iteratively apply a programming pulse to a set of memory cells during programming loops. A programming loop is a process, in which the controller applies a programming pulse to a subset of the set of memory cells to change the programmed level of the memory cells to have a target state according to a programming pulse. A target state is a state that a subset of memory cells is targeted or is assigned to have. For example, a subset of memory cells is targeted to have a last target state (e.g., "G" state) represented by a threshold voltage between 3.0-3.5 V. In another example, a different subset of memory cells may have a target state (e.g., "F" state) represented by a threshold voltage between 2.5-3.0 V.

A programming loop may include a programming phase and a verification phase. During the programming phase, the controller applies a programming pulse to the set of memory cells coupled to a word line, applies a first voltage to bit lines of the subset of the set of memory cells, and applies a second voltage to bit lines of the subset of the set of memory cells. The second voltage may be higher than the first voltage, allowing memory cells in the subset to have the target state according to the programming pulse, while memory cells in the remaining subsets are locked out such that the programming pulse applied does not change states of the memory cells in the remaining subsets. During the verification phase, the controller senses voltages (e.g., threshold voltages) programmed on the subset of the memory cells, and compares the sensed voltages against a verification voltage. A verification voltage is a voltage associated with a target state of a subset of memory cells to verify whether the subset of the memory cells is correctly programmed to have the target state. A verification voltage may be a lowest voltage (e.g., a lowest threshold voltage) that a memory cell is allowed to have for the target state. If a sensed voltage of a memory cell satisfies the verification voltage, the controller determines that the memory cell has reached the target state. If a sensed voltage of a memory cell does not satisfy the verification voltage, the controller determines that the memory cell has not reached the target state. For example, if the sensed voltage is higher than the verification voltage, the controller determines that the memory cell has reached the target state.

In one aspect, magnitudes of the programming pulse are progressively increased between each programming loop to program different subsets of the set of memory cells to corresponding target states. The magnitudes may be progressively increased by a voltage step (e.g., a step size between voltage magnitudes of the programming pulse during sequential programming loops).

The controller is further configured to count a number of under-programmed memory cells from a subset of the set of memory cells. An under-programmed memory cell is a memory cell that has not reached a target state as intended. Often an under-programmed memory cell has experienced a change in the data state it represents however, its current data state is not yet within the range of the target state, or target data state. In an example, a memory cell is intended to be programmed to have a target "G" state with a threshold voltage higher than 3.0V. If the memory cell is not programmed to the "G" state or is not programmed with the threshold voltage higher than 3.0V, then the memory cell is an under-programmed memory cell.

In one aspect, the controller further modifies a subset of the set of memory cells during a final programming loop. A final programming loop is a programming loop in which under-programmed memory cells from the subset targeted to have the last target state are modified to have the last target state. A last target state is a target state associated with a highest one of a plurality of non-overlapping ranges of threshold voltages that are each associated with different states. For example, a last target state is a state associated with a highest range of threshold voltages from single level cell (SLC) or multi-level cell (MLC) programming scheme. Assuming that eight states "Er", "A", "B" . . . "G" states are available, where the eight states are associated with increasing threshold voltages in that sequence, "G" state is the last target state associated with the highest one of the non-overlapping threshold voltages. In an embodiment having four available states "Er", "A", "B", and "C", where the eight states are associated with increasing threshold voltages in that sequence, "C" state is the last target state associated with the highest one of the non-overlapping threshold voltages.

In embodiments where magnitudes of the programming pulse are increased by a uniform voltage step in programming loops, a subset of the set of memory cells is programmed to have the last target state in a last of the programming loops. After one or more programming loops for the last target state, the controller modifies programmed states or threshold voltages of under-programmed memory cells from the subset targeted to have the last target state in a final programming loop. During the final programming loop, the controller may generate a programming pulse that does not increase at the same rate as previous programming pulses. In one embodiment, this is done by decreasing the voltage step by an amount based on the counted number of under-programmed memory cells, and using this smaller voltage step to increase the magnitude of the programming pulse for the final programming loop. Consequently, the final programming loop programs the under-programmed memory cells to the last target state while avoiding excessive programming voltage applied to memory cells coupled to the same word line.

Advantageously, modifying states of the under-programmed memory cells not having the last target state can be performed without compromising speed and accuracy. In one approach, when programming a subset of memory cells coupled to a word line, other subsets of the memory cells coupled to the word line are locked out, such that the other subsets of the memory cells are not programmed according to the programming pulse for programming the subset of the memory cells. However, an excessive voltage applied to the locked out memory cells may alter states of the locked out memory cells. In one example, a state of a subset of memory cells programmed to have a first state (e.g., "Er" state) is more likely to be altered by a programming pulse for programming another subset of the memory cells to have the last target state than other programming pulses. By adaptively generating a programming pulse to modify the under-programmed memory cells not having the last target state to have the last target state, generating a programming pulse with an excessive voltage in magnitude may be obviated by employing a smaller voltage step. Hence, altering a state (e.g., "Er" state) of a different subset of the memory cells coupled to the same word line may be avoided. A programming pulse for programming other subsets to different states other than the last target state may be generated by employing a larger voltage step, thus programming the other subsets of memory cells may be performed with improved speed.

FIG. 1 is a block diagram of a computer system 100, according to an example embodiment. The computer system 100 includes a memory system 114 operating according to commands from a host system 112. The computer system 100 can be any electronic device such as a personal computer, a server computer, a laptop, a smart phone, a tablet computer, a smart watch, etc. The memory system 114 communicates with the host system 112 through a host interface 116. The memory system 114 may be in the form of a removable memory such as a memory card, or may be in the form of an embedded memory system.

The memory system 114 includes a memory device 102, a word line drive circuit 132, a bit line drive circuit 134, and a controller 106. The controller 106 is any component, logic, circuit, or the like configured to control operations of the memory device 102 through the word line drive circuit 132 and the bit line drive circuit 134, according to commands from the host system 112. The memory device 102 includes one or more arrays of non-volatile memory cells 164 distributed over one or more integrated circuit chips. The memory cells 164 may be logically partitioned into a plurality of subsets, where each subset is targeted to be programmed to a corresponding state. Each subset may have a same number of memory cells 164 or a different number of memory cells 164. For example, a first subset may have only a single memory cell 164, and a second subset may have multiple memory cells 164. In one implementation, the memory cells 164 may be logically partitioned into eight subsets. In other embodiments, the memory cells 164 may be partitioned into any number of subsets.

The memory device 102 is a hardware component that stores electronic data. In one aspect, the memory device 102 is embodied as a semiconductor memory device including one or more volatile memory devices, such as dynamic random access memory (DRAM) or static random access memory (SRAM) devices, non-volatile memory devices, such as resistive random access memory (ReRAM), electrically erasable programmable read only memory (EEPROM), flash memory (which can also be considered a subset of EEPROM), ferroelectric random access memory (FRAM), magnetoresistive random access memory (MRAM), other semiconductor elements capable of storing information, or some combination of them.

The memory device 102 can be formed from passive and/or active elements, in any combinations and may include a plurality of memory cells. In a non-limiting example, passive semiconductor memory elements include ReRAM device elements, which in some embodiments include a resistivity switching storage element, such as an anti-fuse, phase change material, etc., and optionally a steering element, such as a diode, etc. Further, in another non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. In a non-limiting example, flash memory devices in a NAND configuration (NAND memory) may include memory elements connected in series. The NAND memory array may be configured so that the array includes one or more memory strings in which a string includes multiple memory elements that share a single bit line. Alternatively, memory elements may be configured so that each element is individually accessible, e.g., a NOR memory array. NAND and NOR memory configurations are exemplary, and memory elements may be configured otherwise.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

In a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

In a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry may be implemented for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

It will be recognized that the following is not limited to the two dimensional and three dimensional exemplary structures described but covers all relevant memory structures within the spirit and scope as described herein.

In some embodiments, the memory device 102 includes word lines 162 and bit lines 166 and sense lines (not shown for simplicity). Word lines 162 may be elongated in one direction (e.g., horizontal direction) and bit lines 166 may be elongated in another direction (e.g., vertical direction). Sense lines may be elongated along the word lines, along the bit lines 166, or along a direction that traverses the directions of the word lines 162 and the bit lines 166. Memory cells 164 may be disposed where corresponding bit lines 166, word lines 162, and sense lines overlap. The word line drive circuit 132 is coupled to word lines 162 of the memory device 102, and the bit line drive circuit 134 is coupled to bit lines 166 of the memory device 102. The word line drive circuit 132 and the bit line drive circuit 134 apply voltages or currents through a word line 162 and a bit line 166 and to program a corresponding memory cell 164. Moreover, the word line drive circuit 132 and the bit line drive circuit 134 applies voltages or currents through the word line 162 and the bit line 166, such that the memory cell 164 can conduct current through a sense line depending on a programmed state of the memory cell.

The word line drive circuit 132 is a circuit to apply voltages or currents to one or more word lines 162 of the memory device 102. In one configuration, the word line drive circuit 132 is coupled between the controller 106 and the word lines 162 of the memory device 102. In this configuration, the word line drive circuit 132 may apply a programming pulse to memory cells through one or more selected word lines 162 according to an instruction from the controller 106. In other embodiments, a word line driver may be utilized in place of the word line drive circuit 132. As used herein, a word line driver may include any component, logic, circuit, or the like configured to apply voltages or currents to one or more word lines 162 of the memory device 102. In one embodiment, the word line driver includes the word line drive circuit 132.

The bit line drive circuit 134 is a circuit to apply voltages or currents to bit lines 166 of the memory device 102. In one configuration, the bit line drive circuit 134 is coupled between the controller 106 and the bit lines 166 of the memory device 102. In this configuration, the bit line drive circuit 134 may apply different voltages or currents to different memory cells through the bit lines 166 according to an instruction from the controller 106. In other embodiments, a bit line driver may be utilized in place of the bit line drive circuit 134. As used herein, a bit line driver may comprise any component, logic, circuit, or the like configured to apply voltages or currents to bit lines 166 of the memory device 102. In one embodiment, the bit line driver includes the bit line drive circuit 134.

The controller 106 controls operations of the memory device 102. In one aspect, the controller 106 configures the word line drive circuit 132 and the bit line drive circuit 134 to iteratively apply a programming pulse to a set of memory cells coupled to the word line. A programming pulse may have progressively increasing magnitudes to program different subsets of the set of memory cells to corresponding target states. A corresponding target state is a target data state associated with or assigned to a given subset of the set of memory cells. In one embodiment, the controller 106 includes an interface circuit 110, a processor 120, read-only-memory (ROM) 122, random access memory (RAM) 130, a programming circuit 180, a verification circuit 185, and a programming correction circuit 190. These components may be embodied as an application specific integrated circuit, field programmable gate array, other controller embodiments known to those of ordinary skill in the art, or a combination of one or more of these implementations. In some embodiment, the controller 106 includes more, fewer, or different components than shown in FIG. 1. In some embodiment, the controller 106 is integrated with the word line drive circuit 132 and the bit line drive circuit 134.

The programming circuit 180 is a circuit that programs the memory cells 164. In one implementation, the programming circuit 180 is coupled to the word line drive circuit 132 and the bit line drive circuit 134. In other embodiments, a programming module may be utilized in place of the programming circuit 180. As used herein, a programming module may include any component, logic, circuit, or the like configured to program the memory cells 164. In one embodiment, the programming module includes the programming circuit 180. The programming circuit 180 may also be considered a means for iteratively applying a programming pulse to a set of memory cells during programming loops, where the programming pulse has progressively increasing magnitudes to program different subsets of the set of memory cells to corresponding target states. The programming circuit 180 configures the word line drive circuit 132 to apply a programming pulse to a word line 162 to program a selected memory cell coupled to the word line. The programming pulse has a programming voltage as a magnitude. The programming circuit 180 configures the bit line drive circuit 134 to apply a voltage or current to a bit line 166 coupled to the selected memory cell, when the programming pulse is applied to the word line. In response to the programming pulse, characteristic (e.g., threshold voltage or storage charge) of a memory cell may change. The programming circuit 180 may also configure the bit line drive circuit 134 to apply another voltage or current to other bit lines 166 coupled to non-selected memory cells that are coupled to the word line 162, such that the non-selected memory cells are locked out to avoid the non-selected memory cells from being programmed, while the selected memory cell is programmed. For example, the another voltage applied to the other bit lines 166 coupled to non-selected memory cells may be higher than the voltage applied to the bit line 166 coupled to the selected memory cell, such that a higher gate-drain voltage or a higher gate-source voltage is applied to the selected memory cell than the non-selected memory cells, thereby allowing the selected memory cell to be programmed according to the programming pulse but not the other memory cells.

The programming circuit 180 configures the word line drive circuit 132 to generate different programming voltages for programming different subsets of memory cells 164. For example, the programming circuit 180 configures the word line drive circuit 132 to generate different programming voltages to program eight different subset of memory cells coupled to a word line. The programming voltages may be separated by a predetermined voltage step. The programming circuit 180 may apply a lowest programming voltage to a subset of memory cells to have a lowest state (e.g., erased state or "Er" state) during a programming loop associated with the lowest state. The programming circuit 180 may iteratively apply a higher programming voltage to a different subset of the memory cells to have a subsequent state. The programming circuit 180 may repeat the process until at least a predetermined number of memory cells is programmed to a last target state (e.g., "G" state).

The verification circuit 185 is a circuit that verifies a status of one or more memory cells. In one configuration, the verification circuit 185 is coupled to the word line drive circuit 132, the bit line drive circuit 134, and a sensing circuit (not shown) coupled to sense lines of the memory device 102. In this configuration, the verification circuit 185 may configure the word line drive circuit 132 and the bit line drive circuit 134 to apply voltages or currents to memory cells 164, and verify programmed states of the memory cells according to programmed threshold voltage sensed through the sensing circuit. The verification circuit 185 may adjust programmed threshold voltages of memory cells such that a lower end of a distribution of programmed threshold voltages is aligned with a verification voltage. In other embodiments, a verification module may be utilized in place of the verification circuit 185. As used herein, a verification module may include any component, logic, circuit, or the like configured to verify a status of one or more memory cells. In one embodiment, the verification module includes the verification circuit 185. In one aspect, the status of the one or more memory cells is a programmed or programming status. In other aspects, the status of the one or more memory cells may be any programming relevant state or condition of the one or more memory cells. Verifying the status may include checking, testing, sensing, and/or determining the status of the memory cells. A characteristic of a memory cell may be an indication of a programmed status or other characteristic of a memory cell. Examples of such a characteristic include a threshold voltage programmed, a current flow through the memory cells, etc. In one embodiment, the verification circuit 185 is coupled to memory cells 164 through sense lines, and sense characteristics of the memory cells 164 through the sense lines. Sensing characteristics of memory cells may include checking, testing, determining, and/or verifying characteristics of the memory cells.

The programming correction circuit 190 is a circuit that corrects programmed states of under-programmed memory cells 164. In one configuration, the programming correction circuit 190 is coupled to the word line drive circuit 132 and the bit line drive circuit 134. In this configuration, the programming correction circuit 190 may detect under-programmed memory cells from a subset of memory cells 164, and correct the programmed states of the under-programmed memory cells. In other embodiments, a programming correction module may be utilized in place of the programming correction circuit 190. As used herein, a programming correction module may include any component, logic, circuit, or the like configured to correct programmed states of under-programmed memory cells 164. In one embodiment, the programming correction module includes the programming correction circuit 190.

The programming correction circuit 190 may detect characteristics of a subset of memory cells to determine whether the subset of memory cells has a target state or not. If a memory cell in the subset does not have the target state, then the programming correction circuit 190 determines that the memory cell is under-programmed. For example, if a memory cell is targeted to be programmed to have a "G" state with a threshold voltage higher than 5.5V but the memory cell is programmed to a threshold voltage of 5.3V, then the programming correction circuit 190 determines that the memory cell is under-programmed.

In one aspect, the programming correction circuit 190 counts a number of under-programmed memory cells, and corrects programmed states of the under-programmed memory cells. The programming correction circuit 190 may adjust a programming voltage to correct the programmed states of the under-programmed memory cells according to the counted number. In one approach, the programming correction circuit 190 reduces a voltage step applied by the programming circuit 180 according to the counted number. For example, the programming correction circuit 190 configures the word line drive circuit 132 to generate a programming voltage by adding a new voltage step to a programming voltage applied by the programming circuit 180 for programming the last target state (e.g., "G" state). The new voltage step may be lower than the voltage step applied by the programming circuit 180, and may be determined according to the number of under-programmed memory cells. The programming correction circuit 190 may configure the word line drive circuit 132 and the bit line drive circuit 134 to program the under-programmed memory cells. In one approach, the word line drive circuit 132 applies the programming voltage to a word line of the under-programmed memory cells, while the bit line drive circuit 134 applies voltages or currents that enable states of the under-programmed memory cells to be corrected but not the other memory cells. By adaptively changing the voltage step or the programming voltage according to the number of under-programmed memory cells, a sufficient programming voltage for correcting the under-programmed memory cells to have threshold voltages higher than the verification voltage can be generated. Hence, changing programmed states of other memory cells coupled to the same word line due to the excessive programming voltage can be obviated.

In some embodiments, the programming correction circuit 190 is integrated together with the programming circuit 180, the verification circuit 185, or both. Detailed descriptions on operations of the programming circuit 180, the verification circuit 185, and the programming correction circuit 190 are provided below with respect to FIG. 2 through 8.

Figure 2:
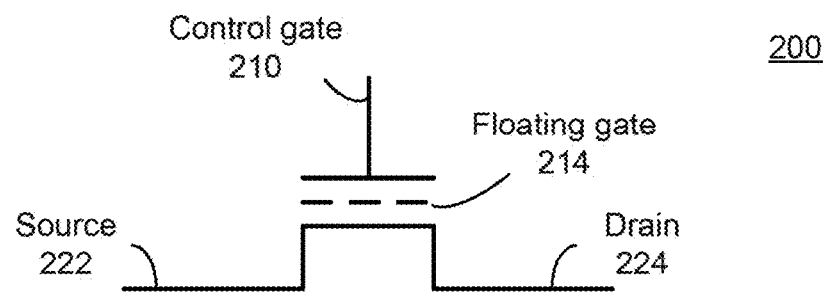
FIG. 2 is a circuit representation of a memory cell of the memory system according to an example embodiment.

FIG. 2 is a circuit representation of a memory cell 200 of the memory system 114. The memory cell 200 can be implemented by a field-effect transistor having a floating gate 214 or a charge trapping (dielectric) layer. The memory cell 200 also includes a source terminal 222, a drain terminal 224, and a control gate terminal 210.

Programming a memory cell 200 may be performed by storing charges at the floating gate 214. In one approach, a hot electron injection technique is used to program the memory cell 200. Hot electron injection results from an accelerating potential built up in the substrate. When an electron having an energy greater than the energy barrier (e.g., 3.1 eV for silicon), the electron passes into the floating gate 214. One method to provide hot electron injection is by having a forward-biased PN junction in the well. Electron injection can be achieved by applying, for example, a voltage which is greater than the energy barrier (e.g., 3.1 eV). The electric field accelerates the electrons to a sufficient energy to reach the floating gate 214 of the memory cell. According to the charges stored by the floating gate 214, a threshold voltage of the memory cell 200 may change.

Reading a state of a memory cell 200 may be performed by sensing the conduction current across the source terminal 222 and drain terminal 224 when a particular voltage is applied to the control gate terminal 210. In one configuration, the control gate terminal 210 is coupled to a word line 162, a drain terminal 224 is coupled to a bit line 166, and a source terminal 222 is coupled to a sense line. The memory cell 200 may conduct current by turning on the memory cell 200. Turning on the memory cell 200 may include applying a voltage to a gate terminal of the memory cell 200. According to a threshold of the memory cell 200, or charges on the floating gate 214, a corresponding conduction current with respect to a fixed reference control gate voltage may be detected. Similarly, the range of charge programmable onto the floating gate 214 defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (e.g., a cell-read reference current). In one implementation, the detection of the conduction current relative to a threshold current is accomplished by examining the rate of the conduction current discharging through the capacitors in sensing circuit.

Figure 3:
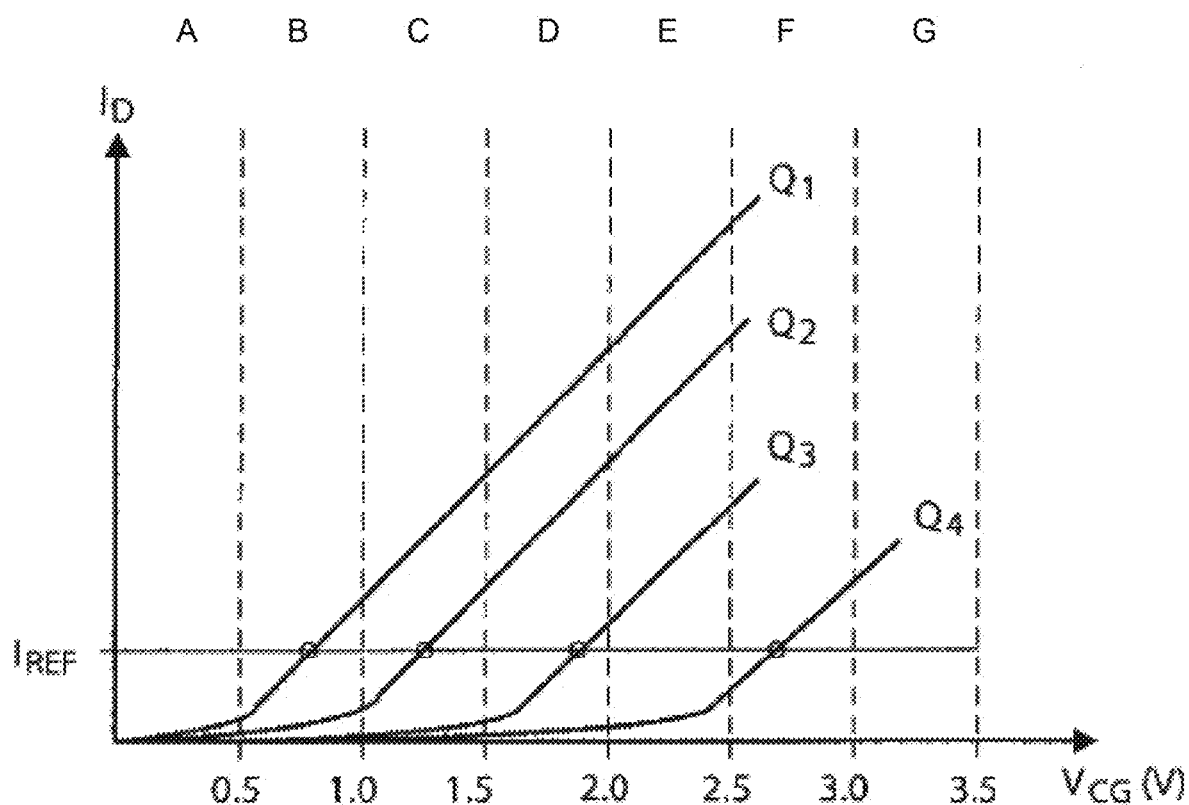
FIG. 3 is a plot illustrating a relationship between a source-drain current and a control gate voltage, according to a charged stored by a floating gate of the memory cell of an example embodiment.

FIG. 3 is a plot illustrating the relationship between the source-drain current $I_D$ and the control gate voltage $V_{CG}$ for four different charges Q1-Q4 that the floating gate 214 may be selectively storing at any one time. With fixed drain voltage bias, the four solid $I_D$ versus $V_{CG}$ curves represent four of seven possible charge levels that can be programmed on a floating gate 214 of a memory cell, respectively corresponding to four possible memory states. As an example, the threshold voltage window of a population of cells may range from 0V to 3.5V. Seven possible programmed memory states "A", "B", "C", "D", "E", "F", "G", and an erased state (not shown) may be demarcated by partitioning the threshold window into regions in intervals of 0.5V each. For example, if a reference current, IREF of 30 nA is used as shown, then the cell programmed with Q1 may be considered to be in a memory state "B" since its curve intersects with $I_{REF}$ in the region of the threshold window demarcated by $V_{CG}$ between 0.5V and 1.0V. Similarly, Q4 is in a memory state "F".

In one aspect, each cell stores two or more pages of data. If a memory cell is capable of storing one of eight different memory states (including the erased state), then the memory state may be represented in three binary bits, where each bit corresponds to a corresponding page data. In one example configuration, "110" represents upper page data "1", middle page data "1", and lower page data "0". Accordingly, a single cell may store multiple bits of data.

Figure 4:
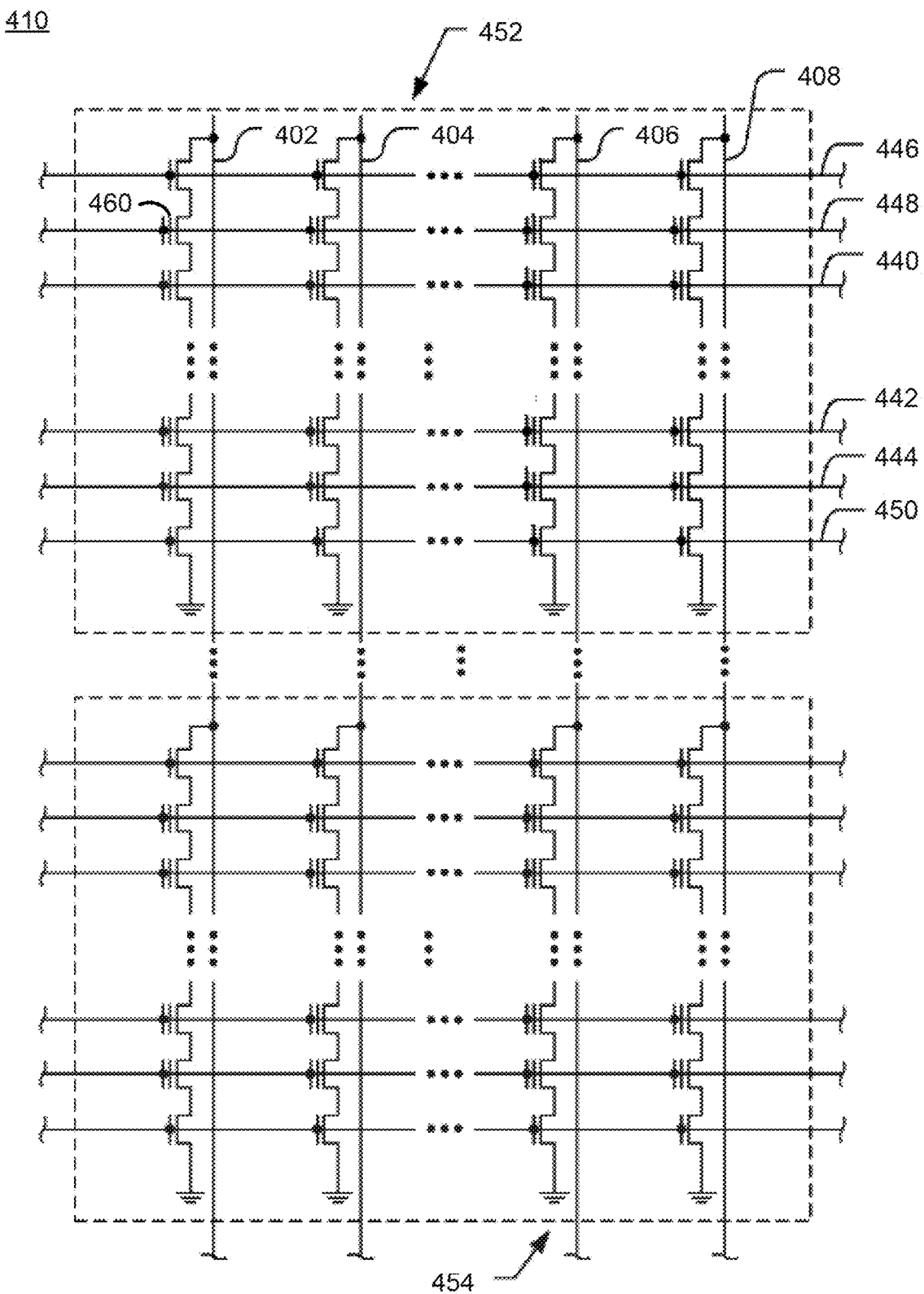
FIG. 4 is a representative circuit diagram of NAND strings according to an example embodiment.

FIG. 4 illustrates NAND strings 410, according to an example embodiment. The NAND strings 410 may be part of different blocks 452, 454. Each block of memory cells includes NAND strings coupled to same word lines, where NAND strings in different blocks may be coupled to same bit lines. For example, NAND strings in the block 452 are coupled to word lines 446, 448, 440, 442, 444, 450, where NAND strings in different blocks are coupled to bit lines 402, 404, 406, 408. In other embodiments, a block of memory cells includes NAND strings coupled to different word lines. Although NAND strings 410 are shown in FIG. 4, in other embodiments, memory cells with different architecture (e.g., NOR) may be implemented.

The NAND strings 410 may be part of the memory device 102 of FIG. 1. Each NAND string may include memory cells 200 of FIG. 2. In particular, each NAND string includes memory cells 460 coupled in series between a corresponding bit line (e.g., bit line 402, 404, 406, or 408) and a reference voltage rail (e.g., ground rail). In this structure, each NAND string includes a plurality of memory cells, where each memory cell may be programmed to store multiple levels of bits. By having multiple memory cells in series in each NAND string, an amount of data stored by each NAND string can be improved compared to having a single memory cell in each NAND string. In other embodiments, different numbers of memory cells are included in each NAND string.

Figure 5:
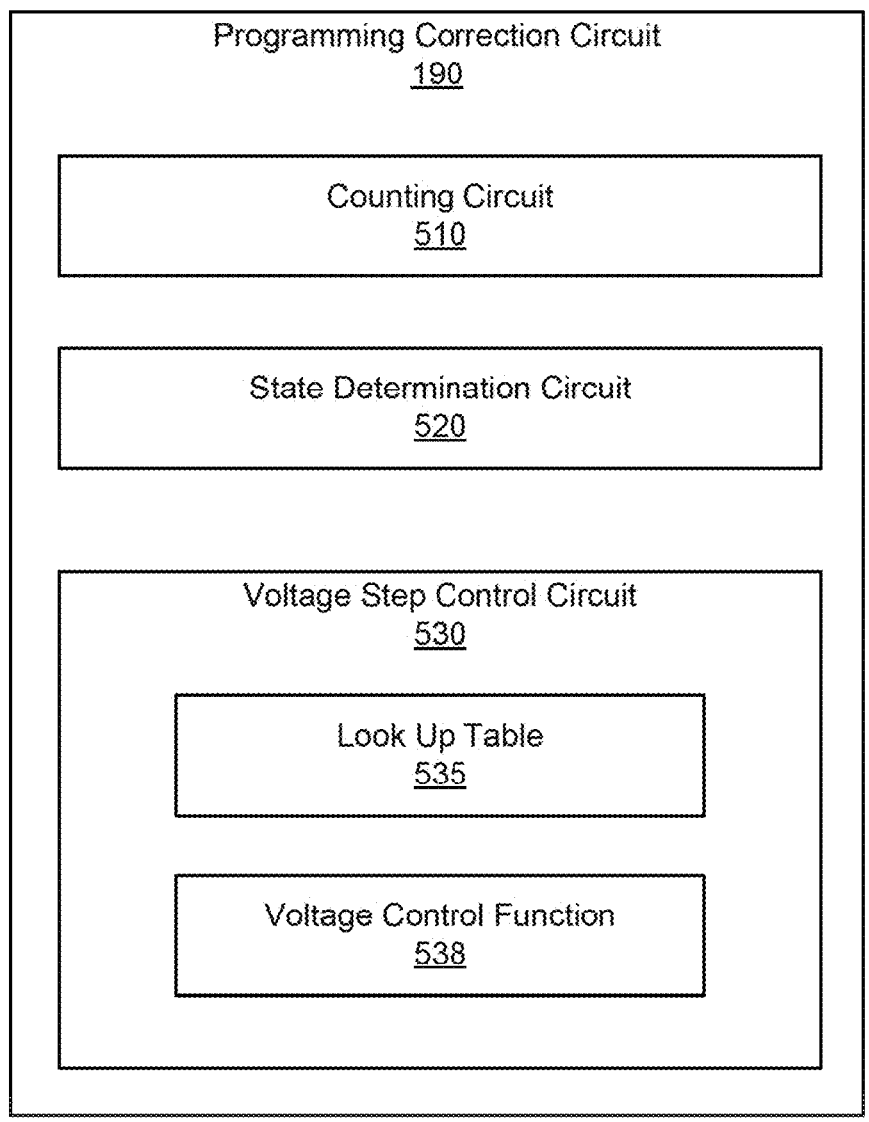
FIG. 5 shows a block diagram of a programming correction circuit according to an example embodiment.

FIG. 5 shows a block diagram of a programming correction circuit 190 according to an example embodiment. In one embodiment, the programming correction circuit 190 includes a counting circuit 510, a state determination circuit 520, and a voltage step control circuit 530. These components operate together to count a number of under-programmed memory cells, and correct programmed states of the under-programmed memory cells. In other embodiments, the programming correction circuit 190 includes more, fewer, or different components than shown in FIG. 5.

The counting circuit 510 is a circuit that counts a number of memory cells having a target state, a number of memory cells not having the target state, or both. In one implementation, the counting circuit 510 is coupled to the word line drive circuit 132 and the bit line drive circuit 134. In other embodiments, a counter may be utilized in place of the counting circuit 510. As used herein, a counter may include any component, logic, circuit, or the like configured to count a number of memory cells having a target state, a number of memory cells not having the target state, or both. In one embodiment, the counter includes the counting circuit 510. The counting circuit 510 may configure the word line drive circuit 132 and the bit line drive circuit 134 to sense characteristics of memory cells to determine whether the memory cells have a target state (e.g., last target state or "G" state). For example, if a memory cell is targeted to be programmed to have a "G" state with a threshold voltage between 5.5V and 6.0V but the memory cell is programmed with a threshold voltage of 5.3V, then the programming correction circuit 190 determines that the memory cell is under-programmed or has not reached the target state. The counting circuit 510 may determine a number of memory cells having a target state (or not having the target state) from a row of memory cells coupled to a word line.

The state determination circuit 520 is a circuit that automatically determines a target state being programmed. In other embodiments, a state determinator may be utilized in place of the state determination circuit 520. As used herein, a state determinator may include any component, logic, circuit, or the like configured to automatically determine a target state being programmed. In one embodiment, the state determinator includes the state determination circuit 520. The state determination circuit 520 may also be considered a means for determining that a final subset of the set of memory cells is programmed. The final subset may include memory cells to be programmed according to a largest magnitude from the progressively increasing magnitudes. In one implementation, the state determination circuit 520 is coupled to the counting circuit 510. The state determination circuit 520 receives a counted number from the counting circuit 510, and determines that a target state is programmed based on the received number. The state determination circuit 520 may determine whether a programming loop for a last target state is executed. In one approach, the state determination circuit 520 obtains, from a row of memory cells, a first number of memory cells that are programmed with threshold voltages above a verification voltage, and compares the first number against a predetermined number associated with a target state (e.g., "G" state). If the first number is below the predetermined number (e.g., 5000), then the state determination circuit 520 determines that a programming loop to program a subset of the row of memory cells to have the target state (e.g., last target state) has not yet been executed. If the first number is above the predetermined number (e.g., 5000), then the state determination circuit 520 determines that a programming loop to program the subset to have the target state (e.g., last target state) has been executed. In another approach, the state determination circuit 520 obtains, from a row of memory cells, a second number of memory cells that are programmed with threshold voltages below a verification voltage, and compares the second number against a predetermined number associated with the target state (e.g., last target state). If the second number is above the predetermined number (e.g., 10000), then the state determination circuit 520 determines that the programming loop to program a subset to have the target state (e.g., last target state) has not yet been executed. If the second number is below the predetermined number (e.g., 10000), then the state determination circuit 520 determines that the programming loop to program the subset to have the target state has been executed.

The counting circuit 510 may determine a number of under-programmed memory cells, a number of successfully programmed memory cells, or both, in response to the state determination circuit 520 determining that the programming loop for the last target state is executed. The counting circuit 510 may also be considered a means for determining a number of memory cells from the final subset having threshold voltages less than a verification voltage of the final subset, in response to determining that the final subset is programmed in the programming loop for the last target state. For example, the counting circuit 510 determines, from a subset of memory cells to be programmed to a target state, a number of memory cells having threshold voltages below a verification voltage associated with the target state to obtain a number of under-programmed memory cells. For another example, the counting circuit 510 determines, from a subset of memory cells to be programmed to a target state, a number of memory cells having the target state to obtain a number of successfully programmed memory cells.

The voltage step control circuit 530 is a circuit that determines a new voltage step to apply in a final programming loop based on a number of under-programmed memory cells, a number of successfully programmed memory cells, or both. In one embodiment, the voltage step control circuit 530 is coupled to the counting circuit 510 and the state determination circuit 520. In other embodiments, a voltage step controller may be utilized in place of the voltage step control circuit 530. As used herein, a voltage step controller may include any component, logic, circuit, or the like configured to automatically determine a new voltage step based on a number of under-programmed memory cells, a number of successfully programmed memory cells, or both. In one embodiment, the voltage step controller includes the voltage step control circuit 530. The voltage step control circuit 530 may also be considered a means for determining a magnitude for a programming pulse for a subsequent programming loop (e.g., a final programming loop) according to a number of under-programmed memory cells from a subset of memory cells targeted to have a subsequent target state (e.g., last target state). A subsequent programming loop is a programming loop occurring after a previous programming loop. A subsequent programming loop may be the next programming loop occurring immediately after a prior programming loop, or it may be any later occurring programming loop that supplements programming of one or more of the memory cells targeted to be programmed by the prior programming loop (e.g., a programming loop occurring any number of programming loops after a given programming loop that supplements programming of one or more of the memory cells targeted to be programmed by the given programming loop). The programming pulse may have a magnitude higher than a magnitude of a previous programming pulse by a voltage step determined according to the number of under-programmed memory cells. Moreover, the voltage step control circuit 530 is considered a means for modifying the memory cells from a subset of the memory cells targeted to have the last target state according to the programming pulse during a final programming loop. The voltage step control circuit 530 determines the new voltage step to apply in a final programming loop, in response to the state determination circuit 520 determining that a programming loop for programming a subset of memory cells with a target state (e.g., last target state or "G" state) is executed. In one embodiment, the voltage step control circuit 530 stores a look up table 535, a voltage control function 538, or both, and applies the number of under-programmed memory cells or the number of successfully programmed memory cells to the look up table 535, the voltage control function 538, or both to determine the new voltage step to apply in the final programming loop. Preferably, the new voltage step is smaller than a voltage step employed by the programming circuit 180. The voltage step control circuit 530 may set the voltage step to a first level, in response to the counted number being between a first predetermined number and a second predetermined number higher than the first predetermined number. The voltage step control circuit 530 may set the voltage step to a second level higher than the first level, in response to the counted number being between the second predetermined number and a third predetermined number higher than the second predetermined number. For example, if a number of under-programmed memory cells is between ten and fifty, the voltage step control circuit 530 determines the new voltage step to be 0.1V. For another example, if a number of under-programmed memory cells is between fifty and one hundred, the voltage step control circuit 530 determines the new voltage step to be 0.2V.

The voltage step control circuit 530 modifies the under-programmed memory cells according to the new voltage step. In one aspect, the voltage step control circuit 530 determines a programming voltage to be a sum of (i) a programming voltage applied by the programming circuit 180 in a programming loop for programming memory cells to the target state (e.g., last target state or "G" state) or a prior programming loop and (ii) the new voltage step. In one aspect, the voltage step control circuit 530 determines the programming voltage for a subsequent programming loop (e.g., a final programming loop) according to the following equation:

$$VPGM_{new} = VPGMU + (Loop-1) \times DVPGM + f(N) \quad \text{Eq. (1)}$$

where $VPGM_{new}$ is a programming voltage determined by the voltage step control circuit 530 for the subsequent programming loop (e.g., final programming loop), VPGMU is a starting programming voltage applied by the programming circuit 180, Loop is a number of iterations of programming loops has been executed, DVPGMU is a voltage step employed by the programming circuit 180, f(N) is a new voltage step determined by the voltage step control circuit 530, and N is a number of under-programmed memory cells for a subset, for example, associated with a corresponding target state (e.g., last target state). In one example approach, f (N) is determined according to Table 1 below:

TABLE 1

| N | f (N) |
|---|---|
| 0 < N < = 10 | 0.1 |
| 100 < N < = 100 | 0.2 |
| 100 < N < = 500 | 0.3 |
| 500 < N < = 1000 | 0.4 |
| 1000 < N < = 2000 | 0.5 |
| ... | ... |

Assuming for an example that the programming circuit 180 applied a programming voltage of 20V in the programming loop for the last target state with a voltage step of 0.8V and twenty of memory cells are under-programmed, the voltage step control circuit 530 determines a new voltage step to be 0.2V. Moreover, the voltage step control circuit 530 determines the new programming voltage to be 20.2V according to the new voltage step (e.g., 0.2V), rather than 20.8V according to the voltage step (e.g., 0.8V) employed by the programming circuit 180. The voltage step control circuit 530 configures the word line drive circuit 132 to apply a programming pulse having the new programming voltage as a magnitude to the memory cells to correct programmed states of the under-programmed memory cells. Hence, applying an excessive programming voltage to the memory cells coupled to a word line in the final programming loop to correct under-programmed memory cells coupled to the word line can be obviated.

Figure 6:
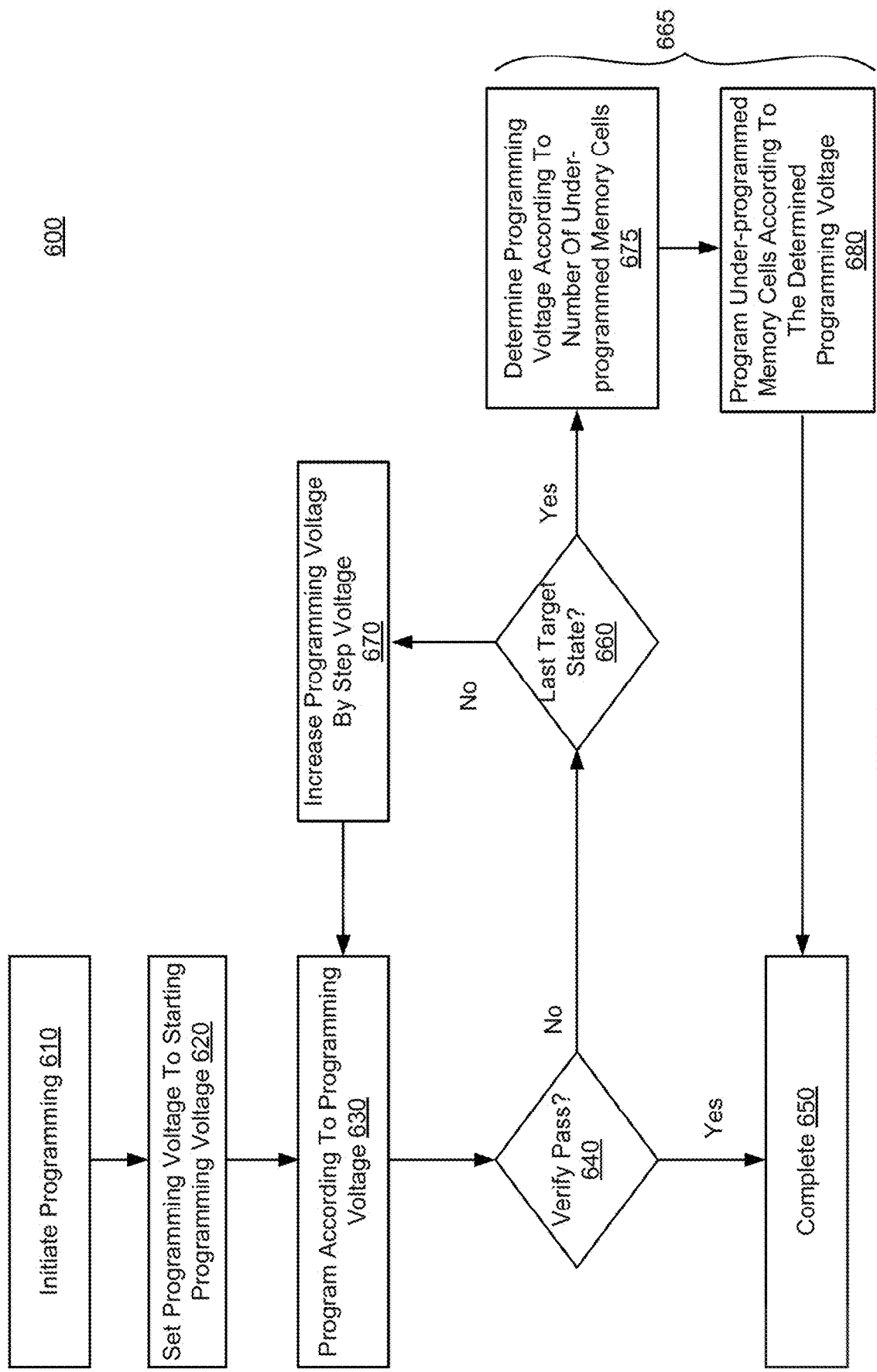
FIG. 6 is a flow chart illustrating a process of programming memory cells by adaptively controlling a programming voltage, according to an example embodiment.

FIG. 6 illustrates a flow chart of an example process 600 of programming memory cells by adaptively controlling a programming voltage, according to an example embodiment. The process 600 may be performed by the controller 106 of FIG. 1. In other embodiments, the process 600 may be performed by other entities. In other embodiments, the process 600 includes more, fewer, or different operations than shown in FIG. 6.

In an operation, the programming circuit 180 initiates 610 programming. In one approach, the controller 106 initiates programming in response to an instruction from a host system 112 to store data by the memory device 102. In an operation, the programming circuit 180 sets 620 a programming voltage to a starting programming voltage VPGMU. The starting programming voltage may be predetermined, for example, at 12V. In some embodiments, a positive or a negative starting programming voltage VPGMU may be employed. In an operation, the programming circuit 180 programs 630 a subset of memory cells coupled to a word line during a programming loop. In one approach, the programming circuit 180 applies a programming pulse having a programming voltage with a given magnitude to the subset of memory cells to program the subset of memory cells. In one aspect, the programming circuit 180 configures the word line drive circuit 132 to apply a programming pulse having the programming voltage with a given magnitude to the word line. The programming circuit 180 may configure the bit line drive circuit 134 to apply voltages or currents to bit lines of a selected subset of the memory cells coupled to the word line, such that the selected subset are programmed according to the programming pulse. The programming circuit 180 may configure the bit line drive circuit 134 to apply different voltages or currents to bit lines of other memory cells coupled to the word line, such that the other memory cells are not programmed according to the programming pulse.

In an operation, the verification circuit 185 verifies 640 whether a sufficient number of memory cells have threshold voltages within a target state for the memory cell. In one approach, a set of memory cells coupled to a word line are divided into subsets, where each subset is targeted to have a corresponding state. For example, a set of memory cells coupled to a word line is divided into eight subsets, where each subset is targeted to be programmed to a state from "Er", "A", "B", "C", "D", "E", "F", and "G" states, each state having a progressively increasing threshold voltage. In one approach, each cell is targeted to have a data value. The data value may be applied to a scrambler. The scrambler may mix up the different data values, such that the numbers of '1' and '0' can be uniformly distributed across a page. If the cells store multiple pages, the threshold voltages could be changed based on the page encoding. The verification circuit 185 may determine whether the subsets of the memory cells coupled to the word line are programmed to corresponding target states. In one aspect, the operation 630 and the operation 640 constitutes a programming loop. If all of the subsets of the memory cells are programmed to the corresponding target states, the process 600 completes 650.

If one or more subsets of the memory cells are not programmed to have their corresponding target states, the process 600 determines 660 whether a programming loop to program a subset of the memory cells to a last target state (e.g., "G" state) is executed. In one approach, the counting circuit 510 determines 660, from a set of memory cells coupled to a word line, a first number of memory cells having threshold voltages above a verification voltage for verifying the last target state (e.g., 5.5V). If the first number is less than a predetermined number (e.g., 5000), then the state determination circuit 520 determines that the programming loop for the last target state has not been executed. In another approach, the counting circuit 510 determines, from a set of memory cells coupled to a word line, a second number of memory cells having threshold voltages less than the verification voltage for verifying a last target state. If the second number is larger than a predetermined number (e.g., 10000), then the state determination circuit 520 determines that the programming loop for the last target state has not been executed. In still another approach, the counting circuit 510 determines, from a subset of memory cells that is last programmed by the programming circuit 180, a number of under-programmed memory cells or successfully programmed memory cells to determine whether programming loop for the last target state has been executed.

If the programming loop to program a subset of the memory cells to a last target state (e.g., "G" state) has not been executed, the programming circuit 180 increases 670 a programming voltage by a default voltage step (e.g., 0.8V), and returns to the operation 630 to program a next subset of the memory cells coupled to the word line in a subsequent programming loop by applying a new programming pulse having the increased programming voltage (e.g., a programming voltage having a magnitude increased by the voltage step) to the memory cells coupled to the word line. Subsets of memory cells that are successfully programmed to corresponding target states may be locked out, such that the successfully programmed memory cells are not programmed according to the new programming pulse.

If the programming loop for the last target state is executed, the programming correction circuit 190 determines 675 a programming voltage according to a number of under-programmed memory cells that have not reached the last target state. In one embodiment, this determination 675 is done by calculating the $VPGM_{new}$ setting. In one approach, in response to determining that the programming loop for the last target state is executed, the state determination circuit 520 enters a final programming loop. The state determination circuit 520 may initiate counting or configure the counting circuit 510 to count, from a selected subset of the memory cells targeted to be programmed to the last target state, a number of memory cells not having the last target state. The selected subset of memory cells may be a subset of memory cells that is last programmed by the programming circuit 180 in the prior programming loop (e.g., programming loop for the last target state). The programming correction circuit 190 compares the counted number of under-programmed memory cells to a look up table or a voltage control function to determine a new voltage step for a final programming loop 665. In some embodiments, the new voltage step is less than the voltage step employed by the programming circuit 180 for prior programming pulses. The programming correction circuit 190 may determine a programming voltage by adding the new voltage step to a previous programming voltage applied by the programming circuit 180 in the prior programming loop to program the subset of memory cells to the last target state.

The programming correction circuit 190 programs 680 under-programmed memory cells according to the determined programming voltage in the final programming loop 665, and completes 650 the process 600. In one aspect, the programming correction circuit 190 configures the word line drive circuit 132 to generate a final programming pulse having the determined programming voltage (with a magnitude increased by the new voltage step) and apply the final programming pulse to the word line. A final programming pulse is a programming pulse applied to adjust programmed states of under-programmed memory cells of a subset of memory cells to change the programmed state of the under-programmed memory cells to a last target state in a final programming loop. The programming correction circuit 190 may configure the bit line drive circuit 134 to apply voltages or currents to bit lines of the subset of memory cells targeted to have the last target state, such that the subset of memory cells is programmed according to the final programming pulse. The programming correction circuit 190 may configure the bit line drive circuit 134 to apply different voltages or currents to bit lines of other memory cells coupled to the word line, such that the other memory cells are locked out and not programmed according to the final programming pulse. For example, a lower voltage is applied to bit lines of the subset of memory cells for the last target state than bit lines of other locked-out memory cells. Because the final programming pulse for programming the subset of memory cells targeted to have the last target state is generated by a voltage step adaptively determined according to a number of under-programmed memory cells not having the last target state, applying excessive voltage to the locked out memory cells may be obviated. Hence, altering states of the locked out memory cells may be prevented.

In one aspect, the process 600 iteratively applies a programming pulse to a set of memory cells coupled to a word line during programming loops. In one aspect, the process 600 determines that a next programming loop to be performed is a final programming loop to program a subset of the set of memory cells targeted to have a last target state of the target states. In one aspect, the process 600 counts a number of memory cells of the subset that have not reached the last target state. In one aspect, the process 600 decreases the step size of the programming pulse for the final programming loop in accordance with the number of memory cells of the subset that have not reached the last target state. In one aspect, the process 600 increases a magnitude of the programming pulse by the decreased step size for the final programming loop. In one aspect, the process 600 applies the programming pulse with the increased magnitude according to the decreased step size to the set of memory cells during the final programming loop.

Figure 7:
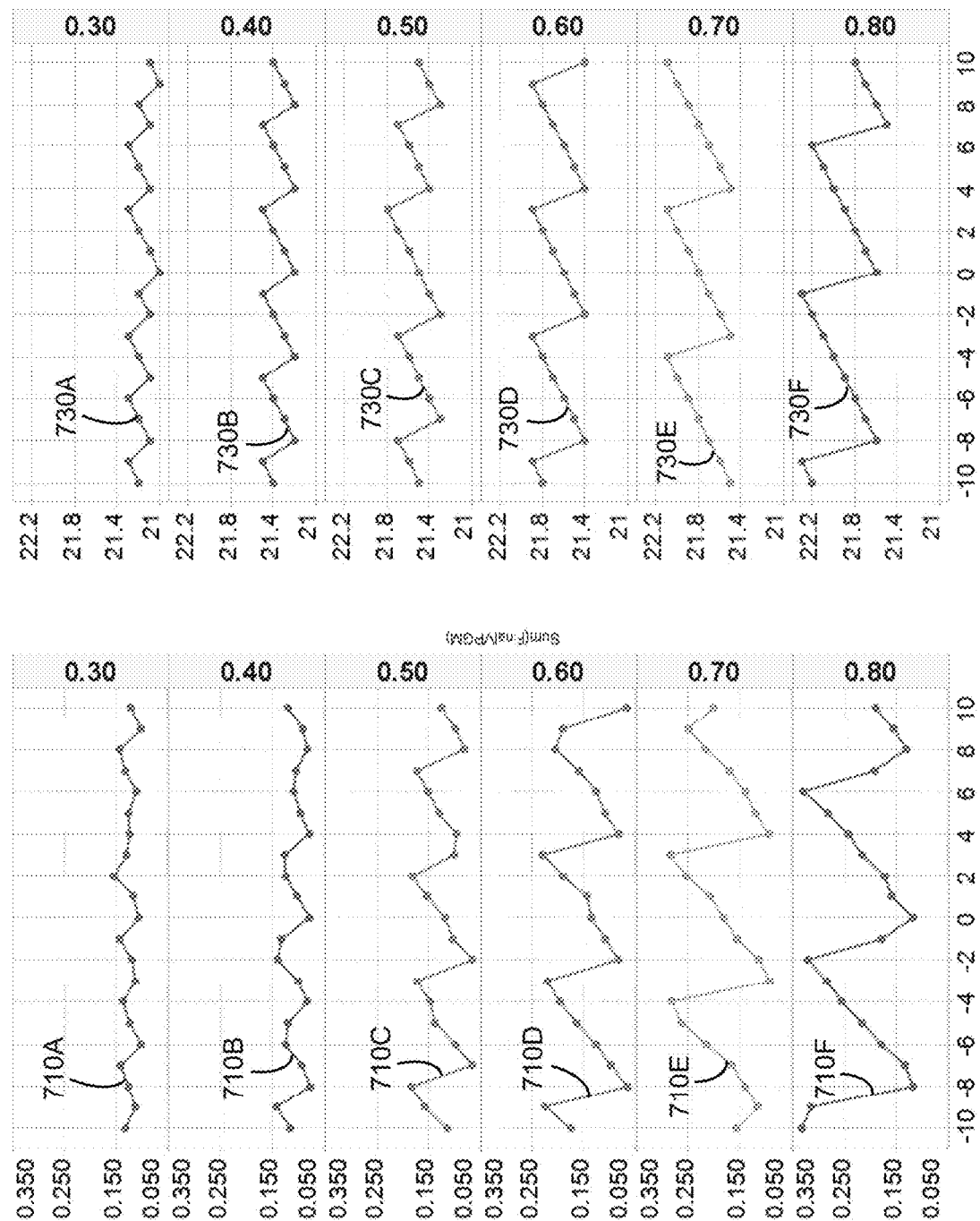
FIG. 7 illustrates plots of variations in programmed states according to different voltage steps, according to an example embodiment.

FIG. 7 illustrates a larger variation in threshold voltages programmed as a larger voltage step is applied. Specifically, FIG. 7 illustrates distributions of variations in programmed states according to different voltage steps, according to an example embodiment. The X-axis in plots 710A, 710B . . . 710F represents a starting programming voltage VPGMU, and the Y-axis in plots 710A, 710B . . . 710F represents a predetermined variation (e.g., 2.5σ) in threshold voltages programmed from a mean of the threshold voltages of "Er" state. Such variation in threshold voltages may occur due to a manufacturing or a process variation or cycling variation. Plots 710A, 710B . . . 710F illustrate variations in threshold voltages programmed for a subset of memory cells targeted to be programmed to "Er" state with different voltage steps. Plots 710A, 710B, 710C . . . 710F are associated with voltage steps 0.3, 0.4, 0.5 . . . 0.8, respectively. Plots 730A, 730B . . . 730F illustrate variations in final programming voltage. Plots 730A, 730B, 730C . . . 730F are associated with voltage steps 0.3, 0.4, 0.5 . . . 0.8, respectively. As shown in plots 710A-710F, increasing a voltage step renders higher difference in the variations in threshold voltages programmed with respect to the starting programming voltage VPGMU. For example, a largest difference in variations of the threshold voltages for the voltage step 0.3V with respect to varying starting programming voltage VPGMU is less than 0.1V as shown in plot 710A, but a largest difference in variations of the threshold voltages for the voltage step 0.8V with respect to varying starting programming voltage VPGMU is more than 0.2V as shown in plot 710F. Thus, a larger voltage step renders a larger variation of threshold voltages programmed.

Figure 8A:
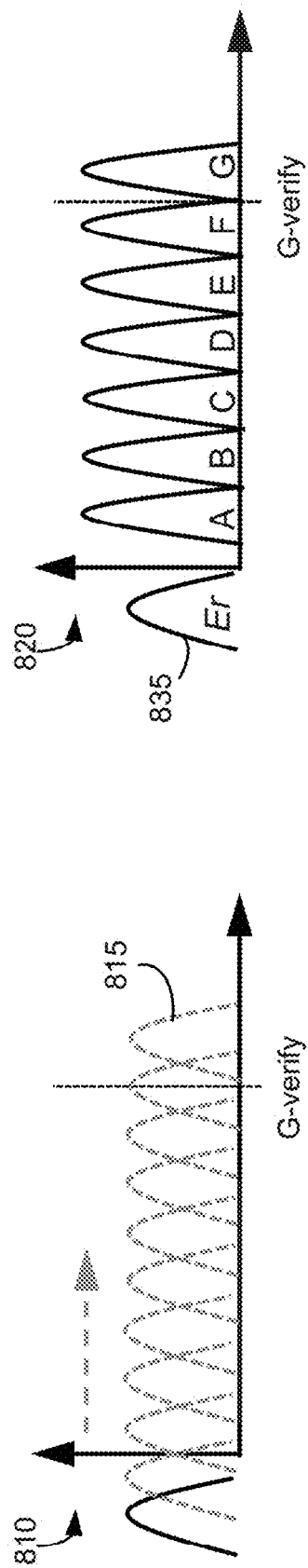
FIG. 8A illustrates distributions of threshold voltages programmed when no excessive programming voltage is applied, according to an example embodiment.
Figure 8B:
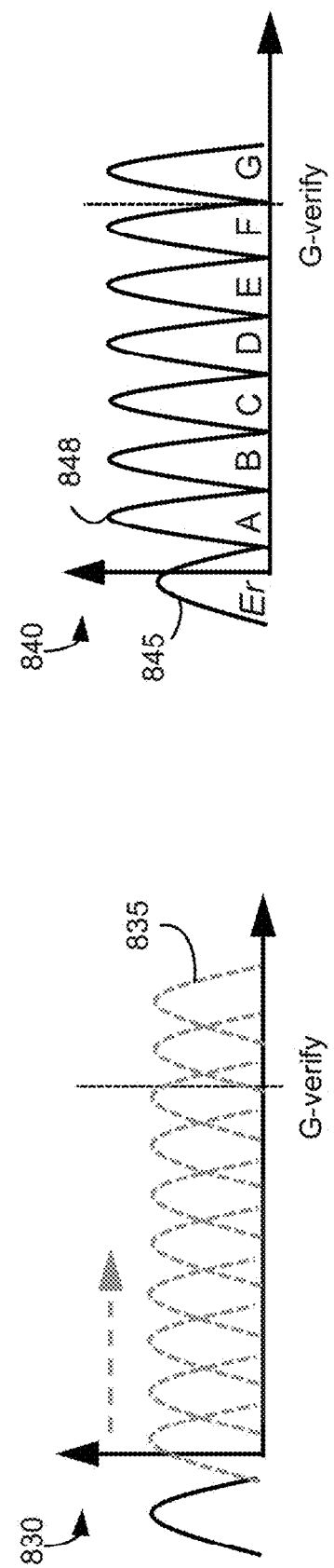
FIG. 8B illustrates distributions of threshold voltages programmed when an excessive programming voltage is applied, according to an example embodiment.

FIGS. 8A and 8B illustrate the effects of voltage step size on the programming of memory cells. As shown below, the concepts discussed within this specification reduce the negative impacts of an excessive voltage generated due to a large voltage step used for successive programming loops. Said another way, the concepts discussed in this specification mitigate the shift in threshold voltages for memory cells of lower states such as "Er" state.

FIG. 8A illustrates distributions, 810/820 of threshold voltages in which no excessive programming voltage is applied, according to an example embodiment. FIG. 8B illustrates an example of programming schemes in which distributions of threshold voltages are programmed when an excessive programming voltage is applied. The smaller voltage step created by the final programming loop discussed above is likely to cause no or little excessive programming voltage similar to that shown in FIG. 8A, whereas a larger voltage step is likely to cause excessive programming voltage similar to that shown in FIG. 8B.

In FIG. 8A, plot 810 shows, in animation form, threshold voltages programmed by increasing programming voltages by a predetermined voltage step during programming loops. In this example, the last programming voltage applied to a subset of memory cells renders a tight, narrow, threshold voltage distribution 815 with a left end aligned with a verification voltage G-verify. Hence, no excessive programming voltage has been applied. After a verification process and an adjustment of programmed states, left ends of threshold voltage distributions become aligned with corresponding verification voltages as shown in plot 820. However, without modifying a voltage step for a final programming loop as disclosed herein, an excessive programming voltage is likely produced when the predetermined voltage step is applied, as discussed below with respect to FIG. 8B.

In FIG. 8B, plot 830 shows threshold voltages programmed by increasing programming voltages by a voltage step that is larger than the voltage step applied in FIG. 8A. In this example, a controller applies the last programming voltage which forms threshold voltage distribution 835 positioned further to the right than desired. The majority of memory cells of distribution 835 have over-shot the target level of G-verify. This is a potential problem because all memory cells coupled to the programmed word line receive the same programming pulse. Generally, a larger voltage step is likely to cause a larger excessive programming voltage which can shift memory cells that are already in their target state (e.g. "Er" state). For example, the threshold voltage distribution 845 for the "Er" state as shown in plot 840 is higher than expected. The right end of the curve has crossed over the vertical axis. Even if disturb mitigation techniques are used to prevent "Er" state cells from shifting to the right, the excess programming voltage used to program cells in "G" state during a last programming loop may shift the "Er" state cells to a higher threshold voltage which may unintentionally overlap with another target state (e.g., "A" state).

FIGS. 9A and 9B illustrate distributions of programmed states that show how the concepts discussed herein correct under-programmed memory cells while minimizing excess programming voltage. FIG. 9A illustrates distributions 910 of programmed states after programming a last target state by a programming circuit 180, according to an example embodiment. FIG. 9B illustrates distributions 920 of programmed states after correcting the under-programmed memory cells of FIG. 9A, according to an example embodiment as discussed above.

As shown in FIG. 9A, the programming circuit 180 increments programming voltages by a voltage step, such that memory cells are programmed according to distributions 910 shown in FIG. 9A. A programming voltage is increased by the voltage step in each programming loop, until remaining unprogrammed cells are targeted for the last target state (e.g., "G" state). After programming the "G" state in the programming loop for the last target state, under-programmed memory cells may have threshold voltages 915 below a verification voltage G-verify, for example, due to variations described above with respect to FIG. 7. In one approach, the counting circuit 510 counts the number of under-programmed memory cells from a subset of memory cells targeted to be programmed to the "G" state. The voltage step control circuit 530 determines a new voltage step according to the number of under-programmed memory cells, for example, based on a look up table, or a voltage control function. The voltage step control circuit 530 determines a programming voltage by adding the new voltage step to a last programming voltage of a prior programming pulse applied by the programming circuit 180 to program the "G" state in the distribution 910. The new voltage step may be determined such that under-programmed memory cells coupled to a word line are modified to have threshold voltages over verification voltage of the "G" state, while avoiding excessive voltage applied to remaining memory cells coupled to the same word line. The voltage step control circuit 530 applies a new programming pulse having the new programming voltage as a magnitude to the under-programmed memory cells to correct programmed state of the under-programmed memory cells to obtain the distribution 920 as shown in FIG. 9B.

Although various embodiments of correcting unsuccessfully programmed memory cells or under-programmed memory cells are disclosed herein, the principle disclosed herein is applicable to under-programmed memory cells. Under-programmed memory cells are memory cells that are programmed with threshold voltages less than a verification voltage of a target state. For example, if a memory cell is not programmed with a threshold voltage between 3.0V and 3.5V associated a target state "G", then the memory cell is an under-programmed memory cell.

The preceding description is directed to certain implementations for the purposes of describing the innovative aspects of this disclosure. However, a person having ordinary skill in the art will readily recognize that the teachings herein can be applied in a multitude of different ways. The described implementations may be included in or associated with a variety of electronic devices such as, but not limited to: mobile telephones, multimedia Internet enabled cellular telephones, mobile television receivers, wireless devices, smartphones, Bluetooth® devices, personal data assistants (PDAs), wireless electronic mail receivers, hand-held or portable computers, netbooks, notebooks, smartbooks, tablets, printers, copiers, scanners, facsimile devices, global positioning system (GPS) receivers/navigators, cameras, digital media players (such as MP3 players), camcorders, game consoles, wrist watches, wearable devices, clocks, calculators, television monitors, flat panel displays, electronic reading devices (such as e-readers), computer monitors, auto displays (such as odometer and speedometer displays), cockpit controls and displays, camera view displays (such as the display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging (such as in electromechanical systems (EMS) applications including microelectromechanical systems (MEMS) applications, in addition to non-EMS applications), aesthetic structures (such as display of images on a piece of jewelry or clothing) and a variety of EMS devices.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logics, logical blocks, modules, circuits and algorithm processes described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and processes described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, such as a combination of a DSP and a microprocessor, a plurality of microprocessors, one or more microprocessors in conjunction with a DSP core, or any other such configuration. In some implementations, particular processes and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

Additionally, a person having ordinary skill in the art will readily appreciate, directional terms are sometimes used for ease of describing the figures, and indicate relative positions corresponding to the orientation of the figure on a properly oriented page, and may not reflect the proper orientation of any device as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. A device comprising:
memory cells; and
a controller coupled to the memory cells, the controller configured to:
iteratively apply a programming pulse to the memory cells during programming loops, the programming pulse having progressively increasing magnitudes to program different subsets of the memory cells to corresponding target states,
determine that a programming loop to program a subset of the memory cells targeted to have a corresponding target state of the target states is performed,
count a number of memory cells of the subset that have not reached the target state,
determine a magnitude for the programming pulse to be applied for a subsequent programming loop based on the counted number, and
during the subsequent programming loop, apply the programming pulse with the determined magnitude to memory cells of the subset that have not reached the target state.

2. The device of claim 1, wherein the subsequent programming loop is a final programming loop, and the corresponding target state is a last target state.

3. The device of claim 2, wherein the progressively increased magnitudes of the programming pulse iteratively applied during the programming loops are increased by a step size, and
wherein a difference between a magnitude of the programming pulse applied in the programming loop and the determined magnitude of the programming pulse applied in the final programming loop is less than the step size.

4. The device of claim 2, wherein the controller is configured to determine the magnitude of the programming pulse for the final programming loop by comparing the counted number to at least one of a voltage control function and a look up table.

5. The device of claim 2, wherein the controller is configured to determine that the programming loop to program the subset of the memory cells targeted to have the last target state of the target states is performed by:
counting a number of memory cells from the memory cells having threshold voltages less than a verification voltage of the subset, and
determining whether the number of memory cells from the memory cells having the threshold voltages less than the verification voltage satisfies a predetermined number.

6. The device of claim 2, wherein the controller is configured to count the number of memory cells of the subset that have not reached the target state by:
counting the number of memory cells from the memory cells having threshold voltages less than a verification voltage of the subset.

7. The device of claim 6, wherein the programming pulse applied in the final programming loop causes the memory cells from the subset having the threshold voltages less than the verification voltage to have threshold voltages equal to or higher than the verification voltage.

8. A system comprising:
a set of memory cells;
a programming circuit coupled to the set of memory cells, the programming circuit configured to program the set of memory cells according to a plurality of programming pulses; and
a programming correction circuit coupled to the programming circuit, the programming correction circuit including:
a counting circuit configured to count a number of first memory cells from a selected subset of the set of memory cells, the first memory cells programmed with threshold voltages less than a verification voltage of the selected subset, and
a voltage step control circuit configured to:
determine a voltage step according to the counted number, and
program the first memory cells according to a final programming pulse, wherein a magnitude of the final programming pulse is different from a magnitude of one of the plurality of programming pulses by the voltage step.

9. The system of claim 8, wherein the magnitude of the one of the plurality of programming pulses is larger than magnitudes of the others of the plurality of programming pulses.

10. The system of claim 8, wherein the programming circuit is configured to:
program different subsets of the set of memory cells to have non-overlapping ranges of threshold voltages, and wherein the selected subset is programmed with a highest one of the non-overlapping ranges of threshold voltages.

11. The system of claim 8, wherein the programming circuit is configured to:
generate other programming pulses for programming other subsets of the set of memory cells, the other programming pulses having magnitudes iteratively increased by another voltage step larger than the voltage step.

12. The system of claim 8, wherein the voltage step control circuit is configured to determine the voltage step by comparing the counted number to at least one of a voltage control function and a look up table.

13. The system of claim 8, wherein the voltage step control circuit is configured to:
set the voltage step to a first level, in response to the counted number being between a first predetermined number and a second predetermined number higher than the first predetermined number, and
set the voltage step to a second level higher than the first level, in response to the counted number being between the second predetermined number and a third predetermined number higher than the second predetermined number.

14. The system of claim 8, wherein the counting circuit is further configured to count a second number of second memory cells from the selected subset, the second memory cells programmed with threshold voltages higher than the verification voltage, the system further comprising:
a state determination circuit coupled to the counting circuit and the voltage step control circuit, the state determination circuit configured to:
compare the second number and a predetermined number, and
initiate a count of the number of the first memory cells in response to determining that the second number is higher than the predetermined number.

15. The system of claim 8, wherein the counting circuit is further configured to count a second number of second memory cells from the set of memory cells, the second memory cells not having a target state of the selected subset, the system further comprising:
- a state determination circuit coupled to the counting circuit and the voltage step control circuit, the state determination circuit configured to:
  - compare the second number and a predetermined number, and
  - initiate a count of the number of the first memory cells in response to determining that the second number is less than the predetermined number.

16. A method comprising:
- iteratively applying a programming pulse to a set of memory cells coupled to a word line during programming loops, the programming pulse having progressively increasing magnitudes according to a step size to program different subsets of the set of memory cells to corresponding target states;
- determining that a next programming loop to be performed is a final programming loop to program a subset of the set of memory cells targeted to have a last target state of the target states;
- counting a number of memory cells of the subset that have not reached the last target state;
- decreasing the step size of the programming pulse for the final programming loop in accordance with the number of memory cells of the subset that have not reached the last target state;
- increasing a magnitude of the programming pulse by the decreased step size for the final programming loop; and
- applying the programming pulse with the increased magnitude according to the decreased step size to the set of memory cells during the final programming loop.

17. The method of claim 16, wherein determining that the next programming loop to be performed is the final programming loop comprises:
- counting a number of memory cells from the set of memory cells having threshold voltages less than a verification voltage of the subset; and
- determining whether the number of memory cells from the set of memory cells having the threshold voltages less than the verification voltage satisfies a predetermined number.

18. The method of claim 17, wherein the programming pulse applied in the final programming loop causes the memory cells from the subset having the threshold voltages less than the verification voltage to have threshold voltages equal to or higher than the verification voltage.

19. The method of claim 16, further comprising:
- programming the different subsets of the set of memory cells to have non-overlapping ranges of threshold voltages, the subset having a highest one of the non-overlapping ranges of threshold voltages.

20. The method of claim 16, wherein decreasing the step size includes:
- applying the number to at least one of a voltage control function and a look up table to determine the step size of the programming pulse for the final programming loop.

21. The method of claim 20, wherein decreasing the step size includes:
- setting the step size to a first level in response to the number being between a first predetermined number and a second predetermined number higher than the first predetermined number; and
- setting the step size to a second level higher than the first level in response to the number being between the second predetermined number and a third predetermined number higher than the second predetermined number.

* * * * *